(12) United States Patent
Ranish et al.

(10) Patent No.: US 10,405,375 B2
(45) Date of Patent: Sep. 3, 2019

(54) LAMPHEAD PCB WITH FLEXIBLE STANDOFFS

(71) Applicant: Applied Materials, Inc., Santa Clara, CA (US)

(72) Inventors: Joseph M. Ranish, San Jose, CA (US); Oleg Serebryanov, San Jose, CA (US); Dongming Iu, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 562 days.

(21) Appl. No.: 14/175,821

(22) Filed: Feb. 7, 2014

(65) Prior Publication Data

US 2014/0255013 A1 Sep. 11, 2014

Related U.S. Application Data

(60) Provisional application No. 61/778,039, filed on Mar. 12, 2013, provisional application No. 61/776,449, filed on Mar. 11, 2013.

(51) Int. Cl.
*H05B 3/00* (2006.01)
*H01L 21/67* (2006.01)

(52) U.S. Cl.
CPC ...... *H05B 3/0047* (2013.01); *H01L 21/67115* (2013.01)

(58) Field of Classification Search
CPC .................. H05B 3/0047; H01L 21/67115
(Continued)

(56) References Cited

U.S. PATENT DOCUMENTS 5,345,534 A * 9/1994 Najm ................ H01L 21/67115
118/724
5,446,824 A * 8/1995 Moslehi ............ H01L 21/67115
118/50.1
(Continued)

FOREIGN PATENT DOCUMENTS

CN 1531740 A 9/2004
CN 102150248 A 8/2011
(Continued)

OTHER PUBLICATIONS

Chinese Office Action for Application No. 201480011025.X dated Apr. 6, 2017.
(Continued)

*Primary Examiner* — Ibrahime A Abraham
*Assistant Examiner* — Biniam B Asmelash
(74) *Attorney, Agent, or Firm* — Patterson + Sheridan LLP

(57) ABSTRACT

The embodiments described herein generally relate to a flexible standoff for use with a lamphead assembly in a thermal processing chamber. In one embodiment, the lamphead assembly can include a lamphead with one or more fixed lamphead positions, a lamp bulb, a lamp base with a standoff contact adaptor and a flexible standoff capable of attaching and positioning the lamp assembly. The flexible standoff can include a socket configured to receive a lamp base of a lamp assembly, a housing configured to position a lamp bulb of a lamp assembly in thermal connection with a processing chamber, a contact adaptor configured to electrically connect to a power supply and a conductive material to electrically connect the socket and the contact adaptor.

11 Claims, 2 Drawing Sheets

(58) Field of Classification Search
USPC ........ 392/411, 416, 407; 219/385, 395, 400, 219/522, 405, 390, 486, 483, 501
See application file for complete search history.

(56) References Cited

U.S. PATENT DOCUMENTS

| | | | | |
|---|---|---|---|---|
| 6,108,491 | A | * | 8/2000 | Anderson ......... H01L 21/67115 118/725 |
| 6,113,703 | A | * | 9/2000 | Anderson ............. C23C 16/455 118/724 |
| 6,121,579 | A | * | 9/2000 | Aoki ..................... C23C 16/481 118/730 |
| 6,121,581 | A | * | 9/2000 | Hegedus ............... C23C 16/481 118/50.1 |
| 6,170,433 | B1 | * | 1/2001 | Du Bois ............... C23C 16/455 118/725 |
| 6,344,631 | B1 | * | 2/2002 | Chacin ................ C23C 16/4585 118/724 |
| 6,947,665 | B2 | * | 9/2005 | Garmer ............. H01L 21/67115 392/411 |
| 8,150,242 | B2 | * | 4/2012 | Merry .................. C23C 16/481 392/407 |
| 9,768,043 | B2 | | 9/2017 | Chang et al. |
| 2004/0156625 | A1 | | 8/2004 | Garmer et al. |
| 2008/0199162 | A1 | * | 8/2008 | Ranish .................... H01K 1/46 392/407 |
| 2008/0199163 | A1 | * | 8/2008 | Ranish .................... H01K 1/28 392/407 |
| 2008/0210163 | A1 | | 9/2008 | Carlson et al. |
| 2010/0111511 | A1 | * | 5/2010 | Merry .................. C23C 16/481 392/411 |
| 2012/0145697 | A1 | * | 6/2012 | Komatsu .......... H01L 21/67115 219/438 |
| 2012/0222618 | A1 | | 9/2012 | Olsen et al. |
| 2015/0179425 | A1 | * | 6/2015 | Ranish .................... H01K 1/46 219/408 |

FOREIGN PATENT DOCUMENTS

| | | |
|---|---|---|
| JP | 09143691 B1 | 6/1997 |
| JP | 2002134430 A | 5/2002 |
| JP | 2002208466 A | 7/2002 |
| JP | 2002289547 A | 10/2002 |

OTHER PUBLICATIONS

Taiwan Office Action for Application No. 103104626 dated Apr. 28, 2017.

* cited by examiner

LAMPHEAD PCB WITH FLEXIBLE STANDOFFS

CROSS-REFERENCE TO RELATED APPLICATIONS

This application claims benefit of U.S. Provisional Patent Application Ser. No. 61/776,449, filed Mar. 11, 2013, and of U.S. Provisional Patent Application Ser. No. 61/778,039, filed Mar. 12, 2013. Both are herein incorporated by reference.

BACKGROUND OF THE INVENTION

Field of the Invention

Embodiments disclosed herein generally relate to semiconductor processing and more specifically to flexible standoffs for use on a printed circuit board (PCB) in an rapid thermal processing chamber.

Description of the Related Art

Rapid thermal processing (RTP) and epi systems are employed in semiconductor chip fabrication to create, chemically alter or etch surface structures on semiconductor wafers. RTP and epi typically depend upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps.

A number of infrared lamps are located in the lamphead. During processing, radiation from the lamps radiates through an upper window, light passageways and a lower window onto a rotating semiconductor substrate in the processing chamber. In this manner, the wafer is heated to a required processing temperature. The lamphead may include a number of light pipes to deliver highly collimated radiation from tungsten-halogen lamps to the processing chamber. The lamps are divided into multiple zones, which are located in a radially symmetrical manner. Each zone is separately powered by a lamp driver that is, in turn, controlled by a multi-input, multi-output controller. The lamps are connected to the SCR drivers through a large wiring collar and heavy-duty electrical cabling.

Some epi chamber designs, and specifically the lamp assemblies, present a number of problems that significantly increase the cost of ownership. Some epi systems use a lamphead/PCB combination which requires lamp assemblies of multiple lengths to properly position the lamp bulb in the lamphead. This increases costs both by requiring a separate manufacturing process for each size and increasing the stock required on hand by the end user for replacements.

Thus, there is a continual need in the art for reducing costs in semiconductor production.

SUMMARY OF THE INVENTION

The embodiments described herein generally relate to flexible standoffs for use in RTP chambers.

In one embodiment, a process chamber for heating a substrate can include a processing chamber, a substrate support disposed within the process chamber for supporting a substrate, a lower dome disposed below the substrate support, a lamphead positioned proximate to the lower dome with one or more fixed lamphead positions formed therein, a lamp assembly, one or more flexible standoffs, each flexible standoff having a socket, the socket configured to receive the contact adaptor, a printed circuit board in electrical connection with the flexible standoff, an upper dome disposed opposing to the lower dome and a base ring disposed between the upper dome and the lower dome, the upper dome, the base ring and the lower dome generally define a processing region of the process chamber. The lamp assembly can include a bulb enclosing at least one radiation generating filament attached to a pair of leads and a lamp base with a contact adaptor, the lamp base configured to receive the pair of leads.

In another embodiment, a lamphead assembly can include a lamphead with one or more fixed lamp positions, a bulb enclosing at least one radiation generating filament attached to a pair of leads, a lamp base with a standoff contact adaptor, the lamp base configured to receive the pair of leads, a flexible standoff comprising a socket and a printed circuit board contact adaptor, the socket configured to receive the standoff contact adaptor and the printed circuit board contact adaptor configured to electrically connect to a printed circuit board.

In another embodiment, a flexible standoff for use with a lamp assembly can include a socket configured to receive a lamp base of a lamp assembly, a housing configured to position a lamp bulb of a lamp assembly in thermal connection with a processing chamber; wherein the housing comprises plastic, flexible glass, ceramic fiber or beads, a contact adaptor configured to electrically connect to a power supply and a conductive material to electrically connect the socket and the contact adaptor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
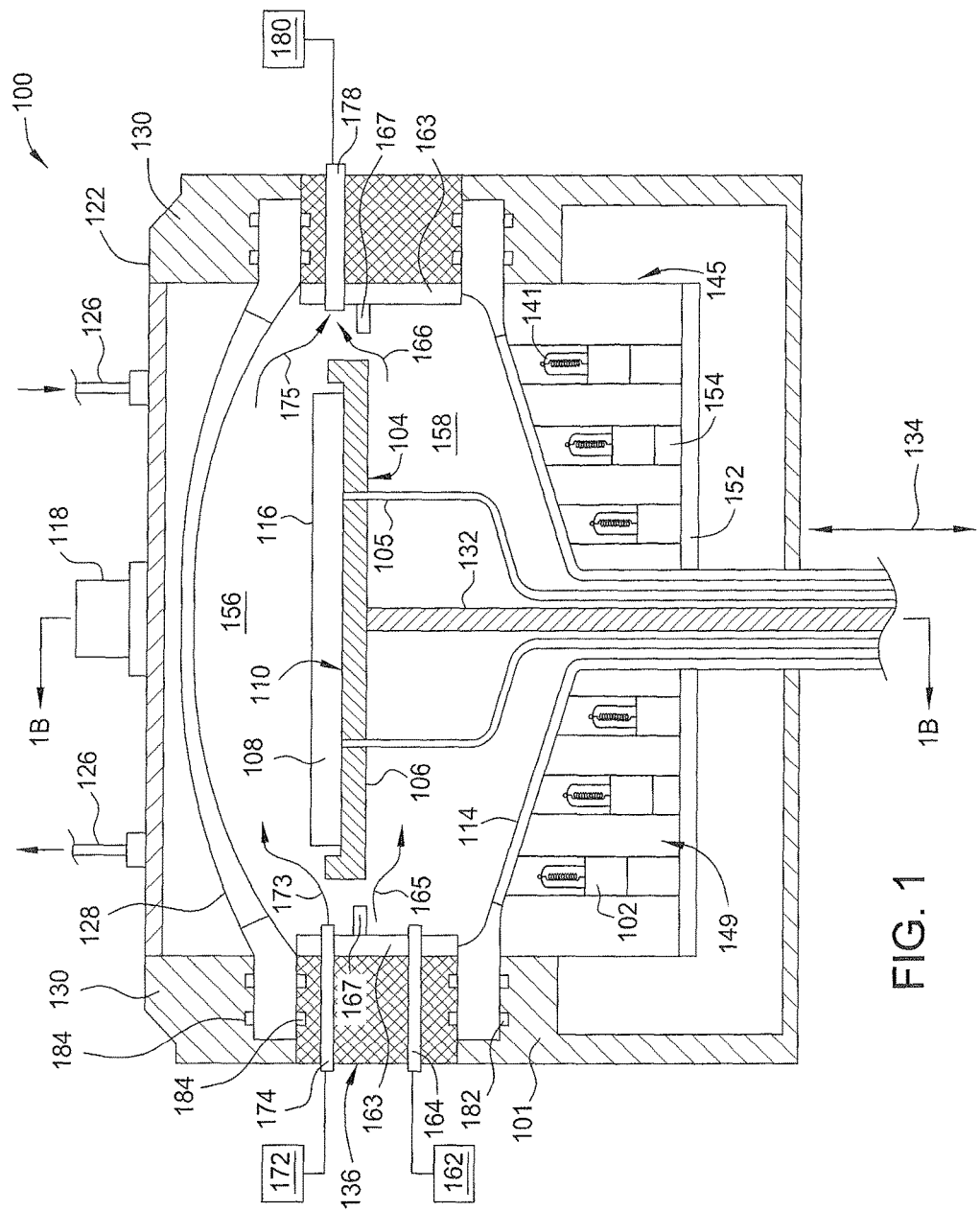
FIG. 1 illustrates a schematic sectional view of a backside heating process chamber according to one embodiment.

Embodiments disclosed herein generally relate to semiconductor processing and more specifically to flexible standoffs for use in an epi or rapid thermal processing chamber. Previous lamp assemblies used in RTP chambers have a lamp bulb and a lamp base, where the lamp base has a length commensurate with the distance from the PCB board to the lower dome. By using a flexible standoff, the lamp base length can be made more uniform and thus the lamp assembly can be made generic. A generic lamp assembly will reduce the cost per replacement while simultaneously reducing the required stock on hand for the end user. Further the current flexible base can be removed. The flexible base used with current lamp assemblies uses approximately 1 cm of space. The flexible standoff has the flexibility for self-alignment thus removing the need for the flexible base and allowing for additional clearance for the lamp assembly. The embodiments of the inventions disclosed herein are more clearly described with reference to the figures below FIG. 1 illustrates a schematic sectional view of a backside heating process chamber 100 according to one embodiment. The process chamber 100 may be used to process one or more substrates, including the deposition of a material on an upper surface of a substrate 108. The process chamber 100 generally includes an array of radiant heating lamps 102 for heating, among other components, a back side 104 of a substrate support 106 disposed within the process chamber 100. The substrate support 106 may be a disk-like substrate support 106 as shown, or may be a ring-like substrate support (not shown), which supports the substrate from the edge of the substrate or may be a pin-type support which supports the substrate from the bottom by minimal contact posts or pins.

The substrate support 106 is located within the process chamber 100 between an upper dome 128 and a lower dome 114. The upper dome 128 and the lower dome 114, along with a base ring 136 that is disposed between the upper dome 128 and lower dome 114, generally define an internal region of the process chamber 100. The substrate 108 (not to scale) can be brought into the process chamber 100 and positioned onto the substrate support 106 through a loading port (not shown), which is obscured by the substrate support 106.

The base ring 136 generally includes the loading port, a process gas inlet 174, and a gas outlet 178. The base ring 136 may have a generally oblong shape with the long side on the loading port and the short sides on the process gas inlet 174 and the gas outlet 178, respectively. The base ring 136 may have any desired shape as long as the loading port 103, the process gas inlet 174 and the gas outlet 178 are angularly offset at about 90° with respect to each other and the loading port. For example, the loading port 103 may be located at a side between the process gas inlet 174 and the gas outlet 178, with the process gas inlet 174 and the gas outlet 178 disposed at opposing ends of the base ring 136. In various embodiments, the loading port 103, the process gas inlet 174 and the gas outlet 178 are aligned to each other and disposed at substantially the same level.

The configuration of the process gas inlet 174 and gas outlet 178 enables a concentric process kit which greatly enhances in the circular shield's ability to contain light leakage which allows the pyrometery to be more accurate at temperatures below 500° C. The base ring 136 may include one or more coolant flow channels (not shown) disposed in proximity to O-rings 182, 184 for cooling of the base ring.

The substrate support 106 is shown in an elevated processing position, but may be vertically traversed by an actuator (not shown) to a loading position below the processing position to allow lift pins 105 to contact the lower dome 114, passing through holes in the substrate support 106 and the central shaft 132, and raise the substrate 108 from the substrate support 106. A robot (not shown) may then enter the process chamber 100 to engage and remove the substrate 108 therefrom though the loading port. The substrate support 106 then may be actuated up to the processing position to place the substrate 108, with its device side 116 facing up, on a front side 110 of the substrate support 106.

The substrate support 106, while located in the processing position, divides the internal volume of the process chamber 100 into a process gas region 156 that is above the substrate, and a purge gas region 158 below the substrate support 106. The substrate support 106 is rotated during processing by a central shaft 132 to minimize the effect of thermal and process gas flow spatial anomalies within the process chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

In general, the central window portion of the upper dome 128 and the bottom of the lower dome 114 are formed from an optically transparent material such as quartz. The thickness and the degree of curvature of the upper dome 128 may be configured to provide a flatter geometry for uniform flow uniformity in the process chamber.

One or more lamps, such as an array of lamp assemblies 102, can be disposed adjacent to and beneath the lower dome 114 in a specified manner around the central shaft 132 to independently control the temperature at various regions of the substrate 108 as the process gas passes over, thereby facilitating the deposition of a material onto the upper surface of the substrate 108. While not discussed here in detail, the deposited material may include silicon, doped silicon, germanium, doped germanium, silicon germanium, doped silicon germanium, gallium arsenide, gallium nitride, or aluminum gallium nitride.

The lamp assemblies 102 may include a heat generating element, depicted here as a lamp bulb 141, and be configured to heat the substrate 108 to a temperature within a range of about 200 degrees Celsius to about 1600 degrees Celsius. In a further embodiment, the heat generating element can include non-incandescing solid radiators, such as an LED, or further radiation producing devices. Each lamp assembly 102 can be coupled to a standoff or a power distribution board, such as printed circuit board (PCB) 152, through which power is supplied to each lamp assembly 102. The lamp assemblies 102 are positioned within a lamphead 145 which may be cooled during or after processing by, for example, a cooling fluid introduced into channels 149 located between the lamp assemblies 102. The lamphead 145 conductively and radiatively cools the lower dome 104 due in part to the close proximity of the lamphead 145 to the lower dome 104. The lamphead 145 may also cool the lamp walls and walls of the reflectors (not shown) around the lamps. Alternatively, the lower dome 104 may be cooled by a convective approach. Depending upon the application, the lampheads 145 may or may not be in contact with the lower dome 114. Further descriptions of the lamp assemblies 102 and the lamphead 145 are discussed below with respect to FIGS. 2A and 2B.

A circular shield 167 may be optionally disposed around the substrate support 106 and coupled to sidewall of the chamber body 101. The shield 167 prevents or minimizes leakage of heat/light noise from the lamps 102 to the device side 116 of the substrate 108 in addition to providing a pre-heat zone for the process gases. The shield 167 may be made from CVD SiC, sintered graphite coated with SiC, grown SiC, opaque quartz, coated quartz, or any similar, suitable material that is resistant to chemical breakdown by process and purging gases.

Conventionally, the substrate temperature is inferred from pyrometer measurements of the bottom of the substrate support by pyrometers (not shown) viewing though ports in the lamphead, 145. This approach may require corrections to be made for reflected lamp radiation particularly at low substrate temperatures and a technique to infer the substrate temperature from the substrate support temperature. As a result of the shield, 167, and backside only heating of the substrate 108 from the substrate support 106, the use of one or more optical pyrometers, one shown as 118, for temperature measurements/control on the substrate can be performed. The previously described temperature measurements are possible because the optical pyrometer 118 can only sense radiation from the hot substrate 108 with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more machined channels 126 connected to a cooling source (not shown). The channel 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

Process gas supplied from a process gas supply source 172 is introduced into the process gas region 156 through a process gas inlet 174 formed in the sidewall of the base ring 136. The process gas inlet 174 is configured to direct the process gas in a generally radially inward direction. During the film formation process, the substrate support 106 is located in the processing position, which is adjacent to and at about the same elevation as the process gas inlet 174, allowing the process gas to flow up and round along flow path 173 across the upper surface of the substrate 108. The process gas exits the process gas region 156 (along flow path 175) through a gas outlet 178 located on the opposite side of the process chamber 100 as the process gas inlet 174. Removal of the process gas through the gas outlet 178 may be facilitated by a vacuum pump 180 coupled thereto. As the process gas inlet 174 and the gas outlet 178 are aligned to each other and disposed approximately at the same elevation, it is believed that such a parallel arrangement, when combing with a flatter upper dome 128 (as will be discussed in detail below), will enable a generally planar, uniform gas flow across the substrate 108. Further radial uniformity may be provided by the rotation of the substrate 108 through the substrate support 106.

Purge gas supplied from a purge gas source 162 is introduced to the purge gas region 158 through a purge gas inlet 164 formed in the sidewall of the base ring 136. The purge gas inlet 164 is disposed at an elevation below the process gas inlet 174. If the circular shield 167 is used, the circular shield 167 may be disposed between the process gas inlet 174 and the purge gas inlet 164. In either case, the purge gas inlet 164 is configured to direct the purge gas in a generally radially inward direction. If desired, the purge gas inlet 164 may be configured to direct the purge gas in an upward direction. During the film formation process, the substrate support 106 is located at a position such that the purge gas flows down and round along flow path 165 across back side 104 of the substrate support 106. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber through the gas outlet 178 located on the opposite side of the process chamber 100 as the purge gas inlet 164.

Exemplary Lamphead Assembly

Figure 2A:
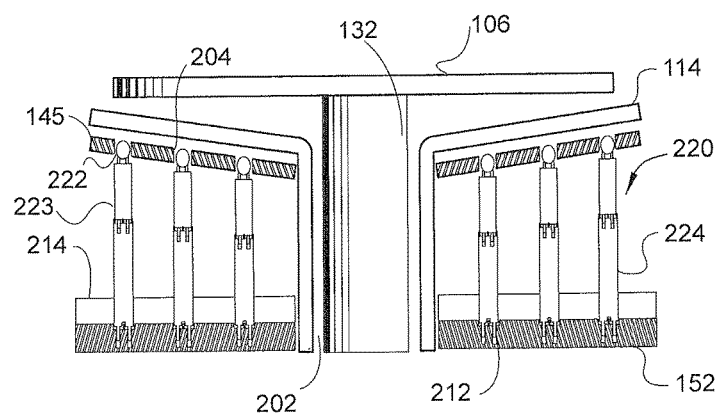
FIGS. 2A and 2B are schematic illustrations of the one or more lamp assemblies including one or more flexible standoffs, according to one embodiment.
Figure 2B:
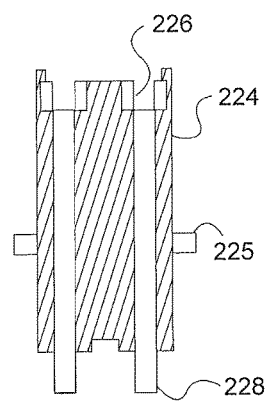

FIGS. 2A and 2B are schematic illustrations of the one or more lamp assemblies 220 including one or more flexible standoffs 224, according to one embodiment. FIG. 2A illustrates a cross-sectional view of a lower dome 114 with a lamphead 145 and a printed circuit board 152 according to one embodiment. As will be discussed below, each of the lamp assemblies 220 can be attached to a flexible standoff 224, which may have a different height in accordance with the angle of the lower dome 114 used. The lamp assembly 220, the flexible standoff 224 and the lamphead 145 are part of the lamphead assembly, alongside other components such as a reflector (not shown). FIG. 2B illustrates the one or more flexible standoffs 224 connected to the one or more lamp assemblies 220 according to one embodiment. As previously described, the lower dome 114 can be formed in the shape of a generally circular, shallow martini glass or funnel with a central opening 202. The lamp assembly 220 is disposed adjacent to and beneath the lower dome 114 in a specified, optimal desired manner around the central shaft (e.g., the central shaft 132 of FIG. 1A) to independently control the temperature at various regions of the substrate.

FIG. 2A depicts the lower dome 114, the PCB 152 and one or more lamp assemblies 220, shown here as six lamp assemblies 220. It will be clear to one skilled in the art that certain elements have been left out of the description for sake of clarity. The PCB 152 can be any standard circuit board designed to control the power distribution to the one or more lamp assemblies 220. The PCB 152 can further comprise one or more connection slots 212, shown here as six connection slots, for connection with the one or more lamp assemblies 220. Though the PCB 152 is depicted here as being flat, the PCB may be shaped according to the needs of the processing chamber. In one embodiment, the PCB board is positioned parallel to the lamphead 145.

Each of the one or more lamp assemblies 220 generally include a lamp bulb 222 and a lamp base 223. The lamp bulb 222 can be a lamp capable of heating and maintaining the substrate at a specified temperature, such as a halogen lamp, an infrared lamp and the like which are adapted as heating devices. The lamp assemblies 220 can be connected with one or more flexible standoffs 224, described in more detail with reference in FIG. 2B.

Though described as including a bulb 222 and a lamp base 223, one or more embodiments can incorporate a radiation generating source in place of the bulb 222, the lamp base 223 or combinations thereof. A radiation generating source is any device capable of generating radiation for heating of the substrate, such as a bulb containing incandescing filament, a bulb containing radiating gas, or a solid state radiation source (e.g. an LED or a laser diode). One skilled in the art will understand that there are various combinations of radiation generating sources which can be used in lieu of or in combination with the bulb 222 or the lamp base 223 without diverging from the embodiments described herein.

The lower dome 114 can be comprised of a translucent material, such as quartz and can incorporate one or more elements described above with reference to lower dome 114, such as the funnel-like shape. The lower dome can be between 4 and 6 mm thick. The lamphead 145 can be positioned under and in close proximity to the lower dome 114. In one embodiment, the lamphead 145 is approximately 1 mm from the lower dome 114.

The lamphead 145 has a plurality of fixed lamphead positions 204 which assure a specific position and orientation of the lamp bulb 222. The lamphead 145 can have as many as 400 or more fixed lamphead positions 204. The fixed lamphead positions 204 can be in a multiple concentric circle orientation. The fixed lamphead positions 204 can increase in depth as the holes extend from the inner radius to the outer radius. The fixed lamphead positions 204 can be bored holes in the lamphead 145. In one embodiment, the lamp bases 223 are held in a fixed orientation by the lamphead 145 and cooled by the lamphead 145.

The lamp assemblies 220 and the connection slots 212 are shown as a set of six, this number is not intended to be limiting. There can be more or fewer of each, as is needed to maintain proper substrate temperature. Further, it is important to understand that this is a side view of a three dimensional structure. As such, though the components appear to be positioned in a linear fashion, any position or combination of positions is possible. For example, on a circular PCB 152, the lamps may be positioned at a 3 cm interval on both the X and Y axis, thus filling the circle. One skilled in the art will understand that there are numerous variations of this embodiment.

FIG. 2B depicts the flexible standoff 224 according to one embodiment. The flexible standoff 224 shown here comprises a socket 226 and a contact adapter 228. The flexible standoffs 224, are depicted here as having a standard socket at socket 226 and an equivalent contact adaptor at contact adapter 228, thus creating the lamp/standoff interface and the standoff/PCB interface. The socket 226 can include a cantilevered multi-leaved contactor type or a different type of double end supported multi-leaved contact type socket. However, this design choice is not intended to be limiting. The socket design can be one of a number of existing designs or designs yet to be created which are capable of transmitting power from a power source to the lamp 222. In one embodiment, the flexible standoff is permanently attached to the PCB 145, such as by soldering.

The flexible standoffs 224 can be composed of both conductive and non-conductive components such that the lamps receive power from the power source. In one example, conductive metals, such as brass or copper, is used to transmit power to the lamp 222 and the conductive metal is surrounded by a nonconductive housing, such as a housing made of plastic, flexible glass or ceramic fiber or beads. The flexible standoffs 224 can be of various lengths as appropriate for proper radiance delivery to the lower dome 114. Since the flexible standoffs 224 vary in length, the lamp assembly 220 can maintain the same general size and shape along the lower dome 114

Furthermore, the flexible standoffs 224 need not be straight. The flexible standoffs 224 can take on curvature so that the lamp axis need not be parallel to that of the processing chamber central axis. Stated another way, the flexible standoffs 224 can allow the lamp axis to take on a desired polar angle(s). The flexible standoffs 224 described herein can be composed of a flexible material, such as a plastic with an elastomer.

The flexible standoffs 224 described herein can provide benefits in both interchangeability and orientation. The flexible standoffs 224, when incorporating either a bent structure or a flexible material, may be connected with a lamphead 145 with fixed lamphead positions 204 which are not oriented perpendicular to the PCB 152. Further, the flexible standoffs 224 are designed to be non-consumable. When the lamp assembly 220 fails, the lamp assembly 220 can be replaced by a single size of lamp assembly 220, thus making the lamp assembly 220 interchangeable in the chamber, regardless of the position of the lamp assembly 220 on the PCB 152 or in the lamphead 145.

The flexible standoffs 224 provide proper positioning between the fixed lamphead positions 204, formed in the lamphead 145, and the connection slots 212 formed in the PCB 152. The lamphead 145 can be composed of a thermally conductive material, such as copper or aluminum. In another embodiment, the lamphead 145 can be a copper conical section or an annulus of revolution which has an inner radius which bring the lamphead 145 in close proximity to the central shaft 132 and an outer radius which is approximately in line with the edge of the lower dome 114.

Formed over the PCB 152 can be one or more support structures, such as a spacer 214. The spacer 214, as shown in this example, can work in conjunction with the PCB 152 and the lamp assembly 220 to maintain a specific direction of the lamp bulb 222, such as maintaining the lamp assemblies 220 in a vertical direction. Further, the flexible standoff 224 can have one or more structures which interact with the spacer 214, such as a lip 225. In this embodiment, the lip 225 ensures complete insertion of the flexible standoff and maintains direction of both the flexible standoff 224 and the lamp bulb 222.

While the foregoing is directed to embodiments of the present invention, other and further embodiments of the invention may be devised without departing from the basic scope thereof, and the scope thereof is determined by the claims that follow.

The invention claimed is:

1. A thermal process structure comprising:
   a printed circuit board comprising one or more contact points;
   a plurality of standoffs having different lengths increased in a radial direction from a center of the printed circuit board to an edge of the printed circuit board, each standoff comprising a radiation source socket and a first adaptor for electrically connecting the standoff to the one or more contact points; and
   a plurality of radiation sources having a radiation source base including a second adaptor for electrically connecting to the radiation source-socket.

2. The thermal process structure of claim 1, wherein the plurality of radiation sources each comprise at least one radiation generating filament.

3. The thermal process structure of claim 1, wherein each standoff further comprises a lip protruded outwardly from an outer surface of the standoff.

4. The thermal process structure of claim 1, wherein the first adapter is soldered, brazed, crimped or permanently connected to the printed circuit board.

5. The thermal process structure of claim 1, wherein the radiation source base or the plurality of radiation sources are at an angle not parallel to a processing chamber central axis.

6. The thermal process structure of claim 1, wherein each of the plurality of standoffs is positioned at an angle parallel to a processing chamber central axis.

7. The thermal process structure of claim 1, wherein each of the plurality of standoffs has a curved shape.

8. A thermal process structure comprising:
a printed circuit board comprising one or more contact points;
a plurality of standoffs having different lengths increased in a radial direction from a center of the printed circuit board to an edge of the printed circuit board, each standoff of the plurality of standoffs comprising:
  a lamp socket disposed at a first end of the standoff; and
  an adaptor extending through the standoff from the first end to a second end of the standoff opposing the first end for electrically connecting the standoff to the one or more contact points; and
a plurality of lamp bases adapted to connect to the lamp socket.

9. The thermal process structure of claim 8, wherein each of the plurality of standoffs has a curved shape.

10. The thermal process structure of claim 8, wherein each of the plurality of standoffs is composed of conductive and non-conductive components.

11. The thermal process structure of claim 8, wherein each standoff further comprises a lip protruded outwardly from an outer surface of the standoff.

\* \* \* \* \*